United States Patent
Tarng et al.

(10) Patent No.: US 6,493,131 B1
(45) Date of Patent: Dec. 10, 2002

(54) WAVELENGTH-LOCKING OF OPTICAL SOURCES

(75) Inventors: Shin-Sheng Tarng, San Jose, CA (US); Slava Yazhgur, Daly City, CA (US); Ting K. Yee, Foster City, CA (US); Peter H. Chang, San Jose, CA (US)

(73) Assignee: Kestrel Solutions, Inc., Mountain View, CA (US)

( * ) Notice: Subject to any disclaimer, the term of this patent is extended or adjusted under 35 U.S.C. 154(b) by 102 days.

(21) Appl. No.: 09/746,370

(22) Filed: Dec. 20, 2000

(51) Int. Cl.[7] .............................. G02F 2/02; G02F 1/01; H04B 10/06
(52) U.S. Cl. ...................... 359/326; 359/191; 359/240; 372/32
(58) Field of Search .................. 359/161, 189–191, 359/237–240, 326, 577, 578; 372/29.01, 29.011, 29.02, 32

(56) References Cited

U.S. PATENT DOCUMENTS 5,181,138 A * 1/1993 Davis et al. ................ 359/239
6,078,418 A * 6/2000 Hansen et al. .............. 359/161

* cited by examiner

*Primary Examiner*—John D. Lee
(74) *Attorney, Agent, or Firm*—Fenwick & West LLP

(57) ABSTRACT

A device is used to wavelength lock two optical signals to some frequency offset. A photomixer section produces a frequency test signal from the beat component of the two optical signals. The frequency of the frequency test signal reflects whether the actual frequency offset of the two optical signals equals the desired offset. A frequency filter with a monotonically varying transfer function is used to filter the frequency test signal. Thus, different gains are applied to different frequencies. Comparison circuitry uses the filtered signal to determine whether the frequency filter applied the gain which corresponds to the desired frequency offset and generates a corresponding error signal.

42 Claims, 13 Drawing Sheets

WAVELENGTH-LOCKING OF OPTICAL SOURCES

BACKGROUND OF THE INVENTION

1. Field of the Invention

This invention relates generally to the wavelength-locking of optical sources such as lasers, and more specifically to locking the sources at wavelengths which are separated from each other by a fixed amount.

2. Description of the Related Art

As the result of continuous advances in technology, particularly in the area of networking, there is an increasing demand for communications bandwidth. For example, the growth of the Internet, home office usage, e-commerce and other broadband services is creating an ever-increasing demand for communications bandwidth. Widespread deployment of new bandwidth-intensive services, such as xDSL, will only further intensify this demand. Moreover, as data-intensive applications proliferate and data rates for local area networks increase, businesses will also demand higher speed connectivity to the wide area network (WAN) in order to support virtual private networks and high-speed Internet access. Enterprises that currently access the WAN through T1 circuits will require DS-3, OC-3, or equivalent connections in the near future. As a result, the networking infrastructure will be required to accommodate greatly increased traffic.

Optical fiber is a transmission medium that is well-suited to meet this increasing demand. Optical fiber has an inherent bandwidth which is much greater than metal-based conductors, such as twisted pair or coaxial cable. There is a significant installed base of optical fibers and protocols such as SONET have been developed for the transmission of data over optical fibers.

Fiber optic communications systems utilize a number of basic building blocks. For example, almost all, if not all, fiber optic systems include a transmitter, an optical fiber, and a receiver. The transmitter converts the data to be communicated into an optical form and transmits the resulting optical data signal across the optical fiber to the receiver. The receiver recovers the original data from the received optical data signal. Other basic building blocks include optical amplification, add-drop multiplexing, wavelength filtering, and wavelength stabilization and wavelength locking of sources.

As one example of wavelength locking, heterodyne receivers typically will require the wavelength locking of two optical signals. These receivers typically have better noise performance than direct detection receivers but they require the use of an optical local oscillator. The optical local oscillator is mixed with the incoming optical data signal. This effectively frequency shifts the optical data signal from its original optical carrier frequency down to the difference frequency between the optical data signal and the local oscillator. Typically, the result is an electrical RF signal, which is then processed to recover the data. For efficient operation, the difference frequency between the two optical signals should be held fairly constant. In other words, the optical local oscillator should be wavelength-locked to the optical data signal with an approximately constant frequency offset.

In some of the examples given below, each of the two optical signals has a wavelength of approximately 1.55 micron with a frequency offset of approximately 11.55 GHz between the two signals. In these examples, the 1.55 micron wavelength is selected because the example application is a fiber optic communications system which uses this wavelength. The 11.55 GHz offset is selected because the example application is designed to use this frequency offset in order to recover the data transmitted over the fiber. For further details on such a system, see co-pending U.S. patent application Ser. No. 09/474,659, "Optical Communications System Using Heterodyne Detection", by Ting K. Yee and Peter H. Chang, filed Dec. 29, 1999; and U.S. patent application Ser. No. 09/728,373, ""Optical Communications System Using Multiple Heterodyne Detection", by Ting K. Yee and Peter H. Chang, filed Nov. 28, 2000. However, these examples are not meant to limit the invention. For example, heterodyne receivers may also be used for free space optical communications (e.g., in satellite communications), optical data storage and recognition, or coherent imaging and holography. The wavelengths and frequency offsets required from the wavelength locker in each of these applications will depend on the specifics of the application.

One approach to wavelength locking uses conventional phase locked loop principles to phase lock the actual frequency difference between the two optical signals to a stable reference sinusoid. This approach typically requires phase/frequency detectors and a source for generating the stable reference sinusoid but these components can be both complex and expensive. In addition, phase locked loops are used primarily to lock signals which are fairly pure sinusoids and to lock the signals with a high degree of accuracy (e.g., to actually lock them in phase). Many wavelength-locking applications, including the heterodyne receiver application discussed above, simply do not fit this profile. For example, in the heterodyne application, the incoming optical data signal is an optical carrier which has been modulated with data so it will not be a pure sinusoid and, as a result, the difference frequency signal to be locked to the reference sinusoid likely also will not be a pure sinusoid. In addition, the local oscillator in heterodyne receivers typically does not have to be locked to the optical data signal with the accuracy intended by phase locked loops. Thus, the super-accurate locking simply adds unnecessary expense and complexity. This is compounded by the fact that many fiber optic systems will require large numbers of the wavelength locking device.

Another approach to wavelength locking which has been attempted is based on gas cells. Many of these approaches try to take advantage of the physical properties of various gases. Thus, through non-linear optical or other physical interactions in the gas, two optical signals are locked to each other or two optical signals at slightly different wavelengths are generated from a common source. However, these approaches typically rely on the physical properties of gases and, therefore, are limited in their applicability. For example, if a particular gas has physical properties which allow the locking of $\lambda 1$ to $\lambda 2$, this is fine if the two wavelengths of interest are $\lambda 1$ and $\lambda 2$ but is irrelevant if any other wavelengths are desired. It can be especially problematic if it is desirable to tune the wavelength locking over a range of wavelengths and a range of frequency separations, as is often the case. In addition, these approaches require the use of a gas cell. The handling of these cells and the gases used to fill them adds expense and complexity.

Thus, there is a need for approaches to wavelength locking of optical signals which are simple, inexpensive and matched in performance to the requirements of the application, particularly since many applications will require a large number of wavelength-locking devices.

SUMMARY OF THE INVENTION

In accordance with the present invention, a device is used for wavelength locking a wavelength-variable optical signal to a target wavelength. The target wavelength is offset from a wavelength of an optical reference signal by a preselected frequency offset. The device includes the following components coupled in series: a photomixer section, a frequency filter and comparison circuitry. The photomixer section includes a square law detector, such as a photodiode. The photomixer section mixes the wavelength-variable optical signal with the optical reference signal to produce a beat component and also produces a frequency test signal from the beat component. When the wavelength-variable optical signal is at the target wavelength, the frequency test signal will be located at a target frequency. The frequency filter has a transfer function which varies monotonically (i.e., either increasing or decreasing) around the target frequency. The frequency filter applies a frequency-dependent gain to the frequency test signal to produce an amplitude test signal. When the frequency test signal is located at the target frequency, the frequency filter will apply a target gain. The comparison circuitry compares the amplitude test signal with an electrical reference signal to determine whether the frequency filter applied the target gain. If it did, then the wavelength-variable optical signal must be at the target wavelength. Based on the determination, the comparison circuitry generates a error signal for adjusting the wavelength of the wavelength-variable optical signal.

This approach has significant advantages compared to traditional approaches, such as those based on phase locked loops. As one example, the circuitry required to implement this approach is significantly simpler than a corresponding phase locked loop. Traditional phase locked loops require a stable sinusoidal reference as well as phase/frequency detectors. In contrast, this approach uses frequency filters and amplitude detectors, which are much simpler devices. Another advantage of this approach over phase locked loops is that this approach is more suitable for handling optical signals which are spectrally broad. For example, in the heterodyne detection application, the optical reference signal is an optical carrier which has been modulated with data and will not be a pure sinusoid. Phase locked loops are primarily designed for very accurate locking of pure sinusoids. Hence they typically will have difficulty with "dirty" signals such as the one just described. In contrast, this approach is well suited for such signals because the frequency filter essentially averages out the effects of a broad spectral signal.

In one embodiment, the frequency test signal includes the beat component and the target frequency equals the preselected frequency offset. In an alternate embodiment, the photomixer section also includes an electrical mixer for frequency shifting the beat component by a fixed amount, for example to an intermediate frequency. The target frequency is correspondingly frequency shifted by the same amount.

In another embodiment, the wavelength-locking device also includes a power divider and an electrical reference arm. The power divider is coupled between the photomixer section and the frequency filter. It splits the frequency test signal into two frequency test signals. One is filtered by the frequency filter. The other is used by the electrical reference arm to generate the electrical reference signal.

In a further refinement of this embodiment, the comparison circuitry includes a pair of matched log amplitude detectors coupled to a differential amplifier. One log amplitude detector is also coupled to the frequency filter and is used to detect a log of an amplitude of the amplitude test signal. The other log amplitude detector is coupled to the electrical reference arm and is used to detect a log of an amplitude of the electrical reference signal. The differential amplifier has two inputs and compares the amplitude of the signals received at the two inputs. The comparison circuitry also includes an adjustable voltage source, which provides an adjustable offset for the differential amplifier.

The use of log amplitude detectors in combination with the adjustable voltage source is advantageous. The voltage source allows an offset to the differential amplifier to be adjusted, which in turn adjusts the target gain, the target frequency and ultimately the frequency offset of the target wavelength. The use of log amplitude detectors allows this offset to be maintained regardless of the amplitude of the incoming optical signals or their beat component.

In further accordance with the invention, a method for wavelength locking a wavelength-variable optical signal to a target wavelength, where the target wavelength is offset from a wavelength of an optical reference signal by a preselected frequency offset, includes the following steps. The optical reference signal and the wavelength-variable optical signal are both received and mixed together to produce a beat component. A frequency test signal is produced from the beat component. When the wavelength-variable optical signal is at the target wavelength, the frequency test signal will be located at a target frequency. A frequency-dependent gain is applied to the frequency test signal to produce an amplitude test signal. In the vicinity of the target frequency, the gain applied varies monotonically with frequency. When the frequency test signal is located at the target frequency, the frequency filter will apply a target gain. An electrical reference signal is received and compared with the amplitude test signal to determine whether the frequency filter applied the target gain. An error signal is generated based on this determination.

BRIEF DESCRIPTION OF THE DRAWING

The invention has other advantages and features which will be more readily apparent from the following detailed description of the invention and the appended claims, when taken in conjunction with the accompanying drawing, in which:

DETAILED DESCRIPTION OF THE PREFERRED EMBODIMENTS

Figure 1:
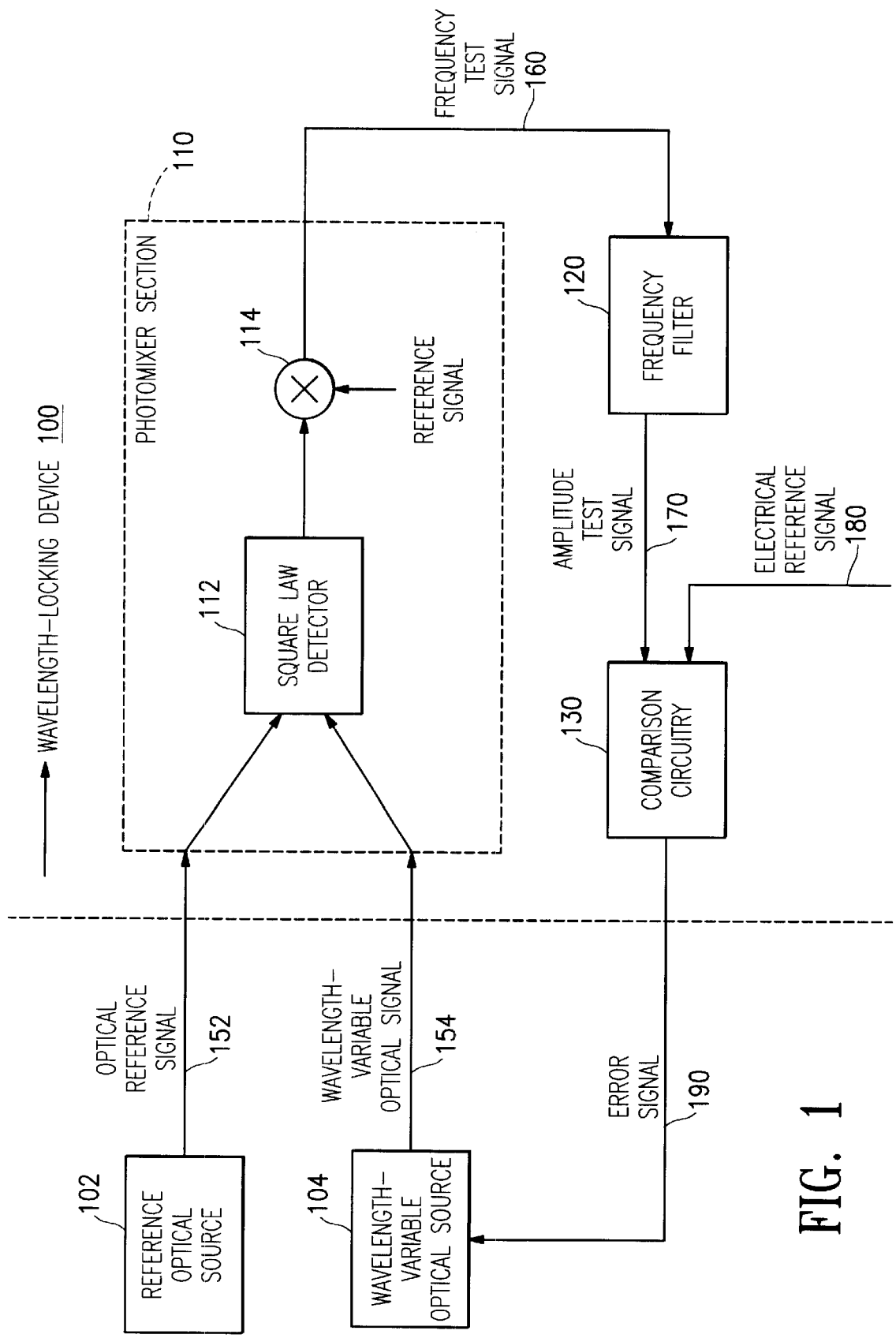
FIG. 1 is a block diagram of a system including the present invention.

FIG. 1 is a block diagram of a system including a wavelength-locking device 100 according to the present invention. Device 100 includes a photomixer section 110 coupled to a frequency filter 120 coupled to comparison circuitry 130. The system in FIG. 1 also includes a reference optical source 102 and a wavelength-variable optical source 104. The photomixer section 110 shown in FIG. 1 further includes a square law detector 112 and also optionally an electrical mixer 114.

Device 100 is used to wavelength lock the two optical sources 102 and 104. More specifically, the reference optical source 102 produces an optical reference signal 152 at a wavelength λo. The output of the wavelength-variable optical source 104 is a wavelength-variable optical signal 154, the wavelength of which may be varied. The wavelength of optical signal 154 is adjusted in response to error signals 190 received from comparison circuitry 130. Device 100 is used to set the wavelength of optical signal 154 at a wavelength which is offset from λo by a preselected amount, which shall be referred to as the frequency offset df. In preferred embodiments, df lies in the RF frequency range. In the examples discussed below, λo is selected as 1.55 microns and df is selected as 11.55 GHz. These numbers are used for illustrative purposes; the invention is not limited to these values.

Current optical fibers have two spectral regions which are commonly used for communications: the 1.3 and 1.55 micron regions. Hence, for these applications, the optical signals 152 and 154 preferably have a wavelength either in the 1.3 micron region or the 1.55 micron region and, for long distance communications systems, the 1.55 micron region is generally preferred. An example of an suitable optical source is a semiconductor laser. In other applications, such as free space optical communications, optical data storage, and coherent imaging and holography, other wavelengths will also be suitable.

Figure 2:
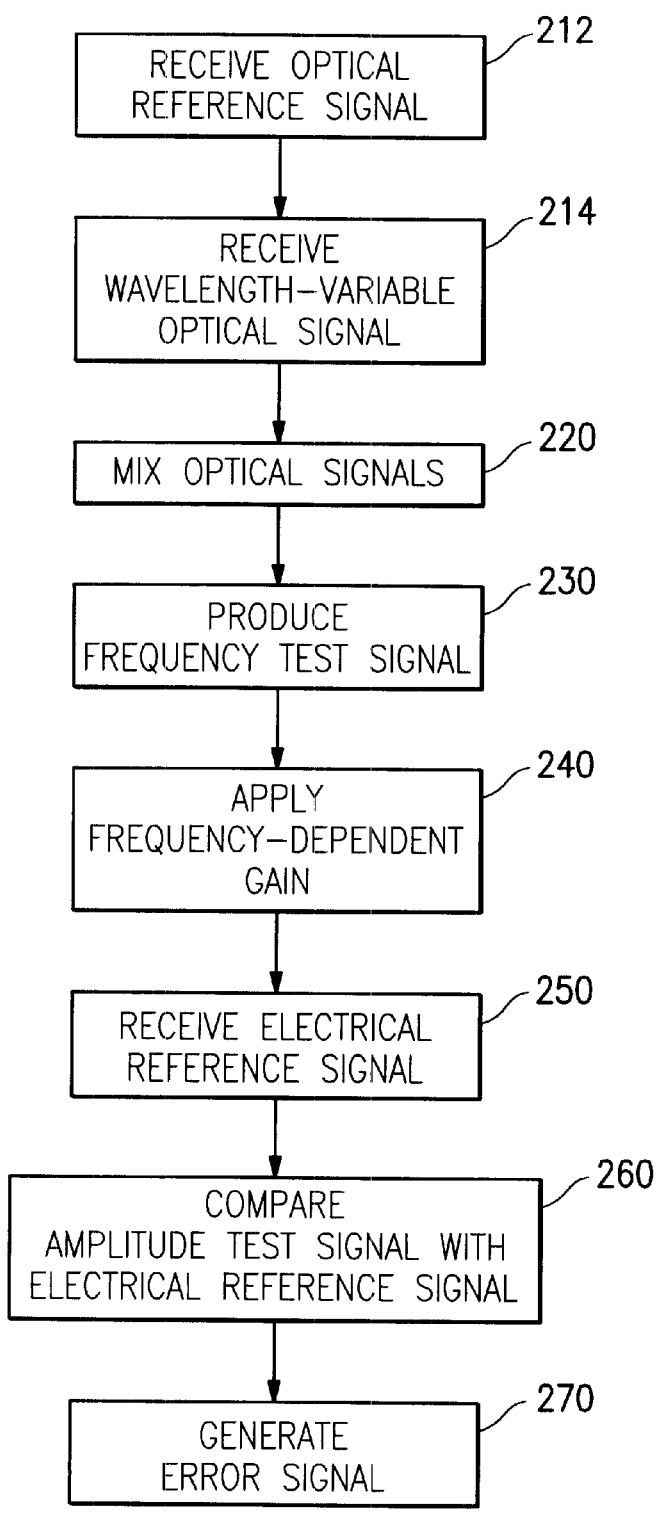
FIG. 2 is a flow diagram illustrating operation of the system of FIG. 1.

FIG. 2 is a flow diagram illustrating the operation of device 100. The photomixer section 110 receives 212 the optical reference signal 152 and also receives 214 the wavelength-variable optical signal 154. The photomixer section 110, in particular the square law detector 112, mixes 220 the received signals together. This results in a component located at the beat frequency of the two signals, as well as other components. The photomixer section 110 produces 230 a frequency test signal 160 from the beat component. In one embodiment, the frequency test signal 160 is located at the same frequency as the beat component, for example if the beat component or a filtered version of the beat component was used as the frequency test signal 160. In an alternate embodiment, the optional electrical mixer 114 frequency shifts the beat component to a lower frequency and this intermediate result is used as the frequency test signal 160.

In any event, the frequency test signal 160 is produced 230 in a manner such that it is located at a target frequency when the wavelength-variable optical signal 154 is at the target wavelength. Thus, if the frequency test signal 160 is located at a frequency other than the target frequency, the wavelength-variable optical signal 154 must not be at the target wavelength. Continuing the two above examples, if the beat component is used as the frequency test signal 160, then the target frequency for the test signal will be the frequency offset df. Alternately, if electrical mixer 114 is used to frequency shift the beat component by a certain amount, the target frequency will also be frequency shifted from the frequency offset df by the same amount. Thus, by examining the actual frequency of the frequency test signal 160, it can be determined whether optical signal 154 is at the target wavelength.

In device 100, this is achieved by passing the frequency test signal 160 through frequency filter 120, but frequency filter 120 is used in an unconventional manner. Normally, frequency filters are used to attenuate unwanted frequency components, and the frequency components of interest are located in the pass band of the frequency filter 120 where the transfer function of the filter is nominally flat. In device 100, the frequency filter 120 has a transfer function which is not flat. Instead, over the operating region of the device, the transfer function has a shape which supports the implementation of a feedback loop to lock the frequency test signal 160 at the target frequency. In a preferred embodiment, the transfer function varies monotonically over the operating region. For example, the transfer function may be monotonically increasing around the target frequency or it may be monotonically decreasing.

By using the frequency filter 120 in this manner, the frequency filter 120 applies 240 a frequency dependent gain to the frequency test signal 160. The resulting signal shall be referred to as the amplitude test signal 170. In effect, the frequency filter 120 converts deviations in frequency to deviations in amplitude. If the frequency test signal 160 is at the target frequency, then the frequency filter 120 will apply a specific gain, which shall be termed the target gain, to the frequency test signal 160. However, if the frequency test signal 160 is located at frequencies other than the target frequency, frequency filter 120 will apply a different gain to the frequency test signal 160. In other words, the gain applied by frequency filter 120 will be the target gain if the frequency test signal is at the target frequency, which in turn occurs when the wavelength-variable optical signal 154 is at the target wavelength. If the optical signal 154 is not at the target wavelength, frequency filter 120 will apply a different amount of gain. Note that the term "gain" is used to mean both attenuation and amplification.

Comparison circuitry 130 receives the amplitude test signal and determines whether the frequency filter 120 applied the target gain. In particular, the comparison circuitry 130 also receives 250 an electrical reference signal 180 and makes the gain determination by comparing 260 the amplitude test signal 170 with the electrical reference signal 180. Comparison circuitry 130 then generates 270 the error signal 190 based on this comparison. For example, if comparison circuitry 130 determines that the gain applied by frequency filter 120 is the target gain, then the error signal 190 will indicate that no wavelength adjustment is required. On the other hand, if comparison circuitry 130 determines that the gain applied by frequency filter 120 is more or less than the target gain, then error signal 190 will indicate that the wavelength of optical signal 154 must be increased or decreased, as appropriate.

This approach has significant advantages compared to traditional approaches, such as those based on phase locked loops. As one example, the circuitry required to implement this approach is significantly simpler than a corresponding phase locked loop. Traditional phase locked loops require a stable sinusoid (for example to lock the beat component) as well as phase/frequency detectors. In contrast, this approach uses frequency filters and amplitude detectors, which are much simpler devices. Another advantage of this approach over phase locked loops is that this approach is more suitable for handling optical signals 152 and 154 which are spectrally broad. For example, in the heterodyne detection application, the incoming optical reference signal 152 is an optical carrier which has been modulated with data and the wavelength optical signal 154 is the local oscillator which is used in the heterodyne detection. Signal 152 will not be a pure sinusoid since it has been modulated with the data to be recovered. Phase locked loops are primarily designed for very accurate locking of pure sinusoids. Hence they typically will have difficulty with "dirty" signals such as the one just described. In contrast, this approach is well suited for such signals because the spectral response of the frequency filter 120 essentially averages out the effects of a broad spectral signal. Furthermore, the accuracy for which phase locked loops are designed typically is not required in applications such as the heterodyne one.

Figure 3:
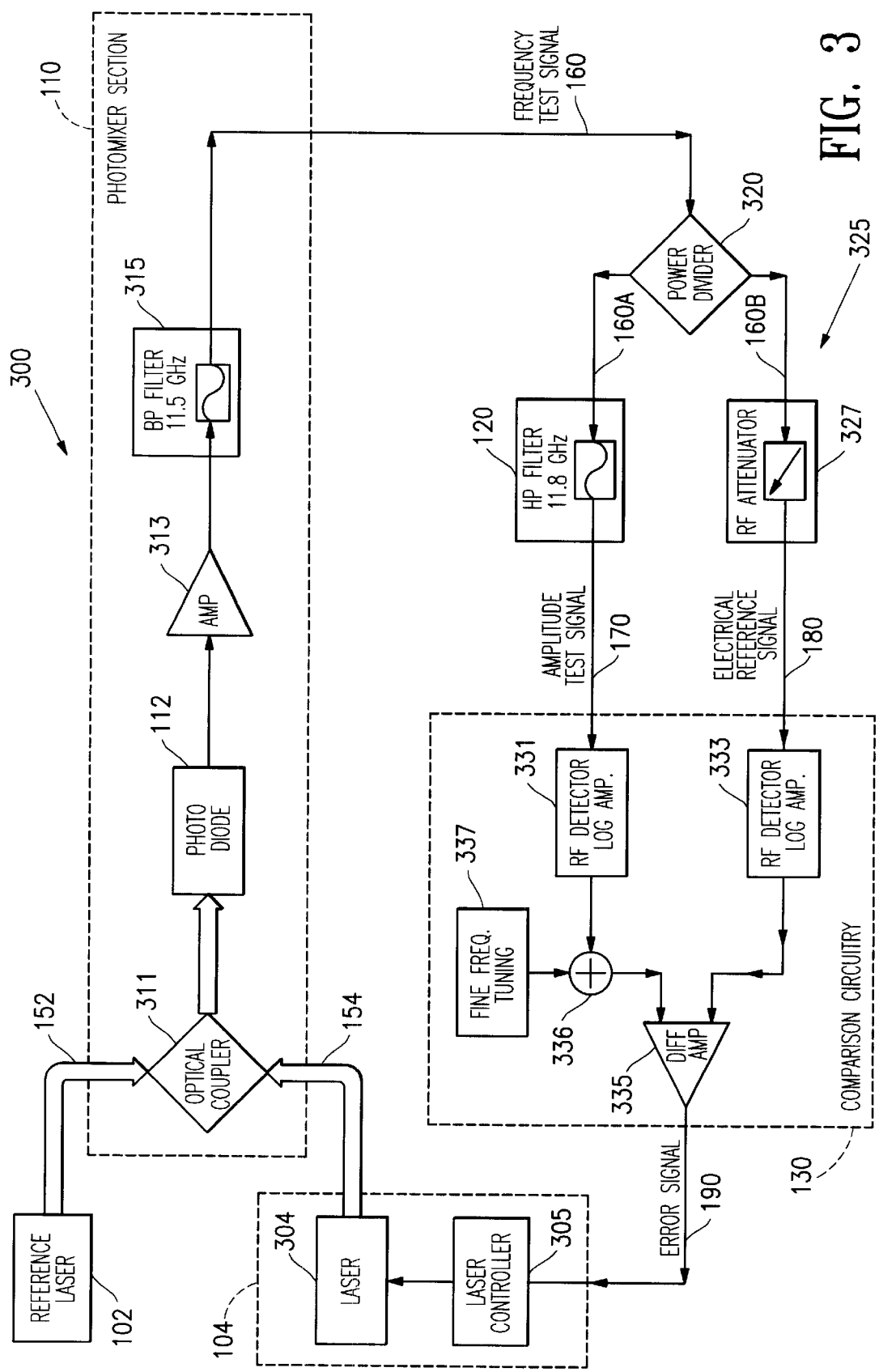
FIG. 3 is a block diagram of one embodiment of the wavelength-locking device of FIG.

FIG. 3 is a block diagram of one embodiment 300 of device 100. The photomixer section 110 of this embodiment includes the following components coupled in series: an optical coupler 311, a photodiode which operates as the square law detector 112, an amplifier 313 and a bandpass filter 315. The two optical sources 102 and 104 include laser diodes which operate in the 1.55 micron region. It is desired to lock wavelength-variable laser 104 to reference laser 102 with a frequency offset of 11.55 GHz, with laser 104 having the shorter wavelength.

Photomixer section 110 operates as follows. The optical coupler 311 optically combines the optical reference signal 152 with the wavelength-variable optical signal 154. The combined optical signal is detected by photodiode 112, which effectively mixes these two signals together since it is a square law detector. The two signals 152 and 154 preferably are matched in polarization in order to increase the efficiency of the mixing. This mixing results in a number of frequency components, one of which is located at the beat frequency between the two optical signals 152 and 154. In this example, if laser 104 is operating at the correct frequency offset, the beat component will be located at 11.55 GHz. If laser 104 is operating at the wrong wavelength, the beat component will be located at a different frequency but generally will be in the vicinity of 11.55 GHz. Amplifier 313 amplifies the beat component and bandpass filter 315 selects this component. In this particular example, the pass band of filter 315 is 400 MHz wide and centered at 11.55 GHz.

Device 300 includes a power divider 320 coupled between the photomixer section 110 and the frequency filter 120. The power divider 320 splits the frequency test signal 160 into two frequency test signals 160A and 160B. The first test signal 160A is received by the frequency filter 120. The other test signal 160B is received by an electrical reference arm 325, which generates the electrical reference signal 180 from the frequency test signal 160B. In this case, the electrical reference arm 325 includes a 6 dB RF attenuator 327. Preferably, the frequency filter 120 is a high pass filter, with a 3 dB point located at 11.8 GHz.

Figure 4:
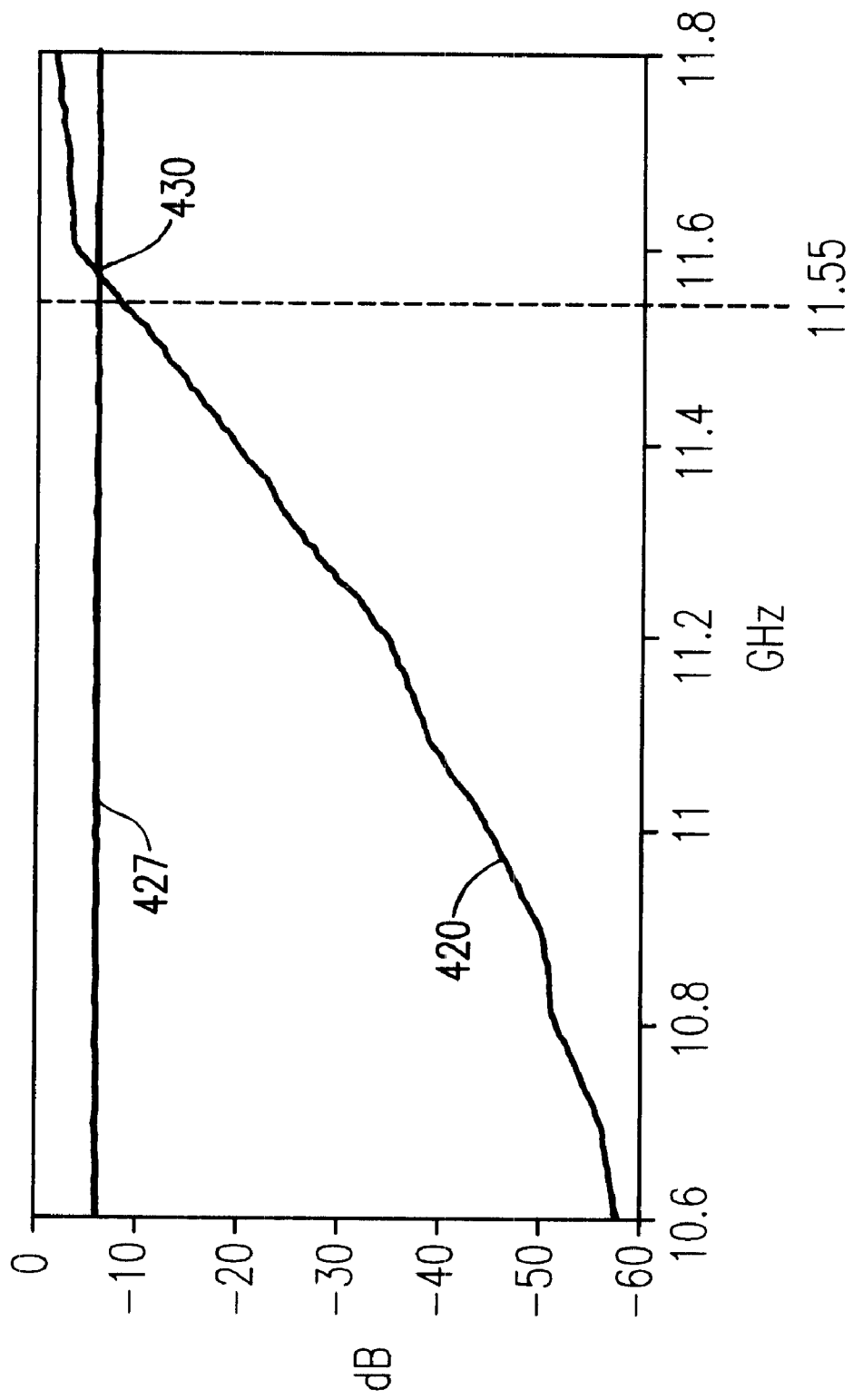
FIG. 4 is a graph illustrating the transfer functions for the high pass filter and RF attenuator in the device of FIG. 3.

FIG. 4 is a graph illustrating the transfer functions for high pass filter 120 and RF attenuator 327. Curve 420 shows the monotonically increasing transfer function for high pass filter 120, with a 3 dB point at 11.8 GHz. Curve 427 shows 6 dB attenuation which is independent of frequency. The two curves cross at point 430. If the crossover point 430 is located at the target frequency (i.e. 11.55 GHz in this example), then the comparison circuitry 130 can simply determine whether the amplitude of amplitude test signal 170 is equal to the amplitude of electrical reference signal 180. If the two are equal, then the frequency filter 120 must have applied the target gain which means that the frequency test signal 160 must have been at the target frequency. On the other hand, if the amplitude test signal 170 is weaker than the electrical reference signal 180, then filter 120 must have applied too much attenuation and, from curve 420, the frequency test signal 160 must be located at a frequency below the target frequency. Conversely, if amplitude test signal 170 is stronger than electrical reference signal 180, the frequency test signal 160 must be located at a frequency above the target frequency. Note that the determination of whether the frequency filter 120 applied the target gain is insensitive to variations in the amplitude of frequency test signal 160 (and, therefore, also insensitive to variations in the amplitude of the incoming optical signals 152 and 154) since both the amplitude test signal 170 and the electrical reference signal 180 are derived from the frequency test signal 160 and will equally reflect any such variations.

Comparison circuitry 130 of FIG. 3 shows one configuration which may be used to achieve this comparison. Generally speaking, the circuitry 130 includes a pair of matched amplitude detectors 331 and 333 which are coupled to a differential amplifier 335. Amplitude detector 331 is coupled to frequency filter 120 and detects the amplitude of the amplitude test signal 170. Amplitude detector 333 is coupled to the RF attenuator 327 and detects the amplitude of the electrical reference signal 180. The differential amplifier 335 compares the two detected amplitudes and generates the corresponding error signal 190.

The above discussion assumed that the crossover point 430 was located at the target frequency. The comparison circuitry 130 shown in FIG. 3 is one embodiment which accounts for the case if this is not exactly true. Referring again to FIG. 4, for the actual curves shown, the target frequency of 11.55 GHz lies approximately but not exactly at the crossover point 430. Assume for the following discussion that the target frequency lies slightly to the left of crossover point 430. In this case, the transfer function 420 of the high pass filter 120 must be boosted slightly with respect to attenuator 427 in order for the crossover point to fall at the correct target frequency. This is achieved in device 300 not by altering the actual gain characteristics of either filter 120 or attenuator 327 (although this approach could be used in alternate embodiments), but by adding an offset 337 to the differential amplifier 335. In particular, an adjustable voltage source 337 and the output of log amplitude detector 331 are coupled to a voltage summer 336, which is then coupled to the differential amplifier 335. In this way, voltage source 337 provides an adjustable offset, in order to allow adjustment over a range of target frequencies. By adjusting the voltage produced by voltage source 337, the crossover point 430 may be shifted away from the point shown in FIG. 4, thus also shifting the target frequency, in this case to the desired target a frequency of 11.55 GHz.

In this specific example, the two detectors 331 and 333 are American Microwave Corporation LVD-218 detector/log amplifiers and the voltage source 337 is adjusted by a trim resistor. The advantage of using log amplitude detectors rather than linear detectors can be shown mathematically as follows. Let A=amplitude of frequency test signals 160A and 160B
G1=gain applied by high pass filter 120 at the target frequency
G2=gain applied by the reference arm 325 (i.e., RF attenuator 327 in this case)

dV=voltage offset introduced by voltage source 337

Then, the two voltages V1 and V2 seen at the inputs of differential amplifier 335 are given by:

V1=dV+k log (G1)(A)

V2=k log (G2)(A)

where k is a proportionality constant for the log amplitude detectors. Setting V1=V2 yields G2/G1=exp(dV/k)

Note that equality does not depend on the amplitude A of the frequency test signal. Rather, equality is achieved for a particular ratio of the gain applied by the frequency filter 120 to the gain applied in the electrical reference arm 325. Furthermore, the ratio is 1 when the voltage offset dV=0 and the ratio may be adjusted by adjusting dV.

Referring again to FIG. 3, the wavelength-variable laser 104 includes a laser controller 305 coupled to laser 304. The laser controller 305 receives the error signal 190 from comparison circuitry 190 and adjusts the wavelength of laser 304. Common methods for achieving this include changing the temperature of laser 304 or changing the drive current to laser 304. Standard control algorithms are appropriate for closing the feedback loop and in alternate embodiments, the system may include microcontrollers, digital signal processors or other types of processors to implement the control algorithms.

Figure 5:
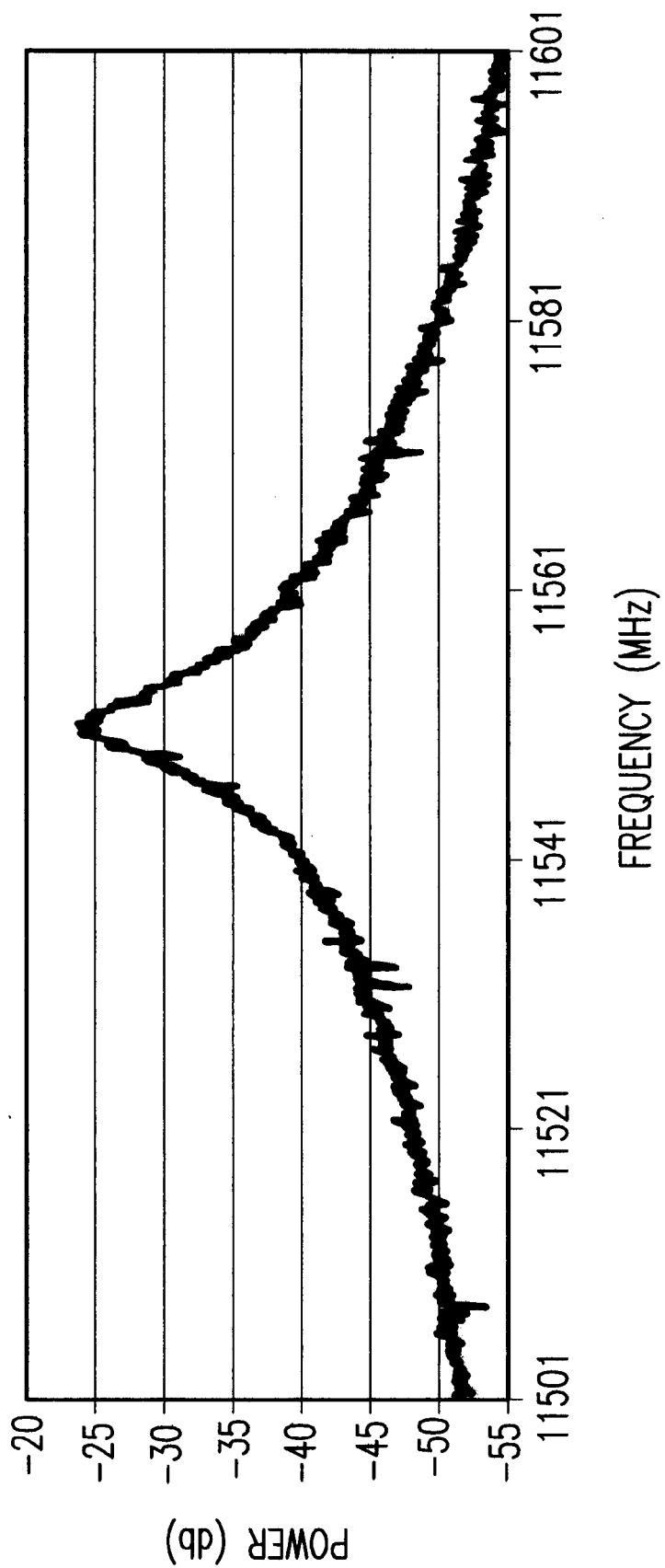
FIG. 5 is graph illustrating the performance of the device of FIG. 3.

FIG. 5 is a graph illustrating the performance of device 300. In particular, FIG. 5 shows the spectrum of the frequency test signal 160 in an experiment conducted using the device 300 described above.

Figure 6:
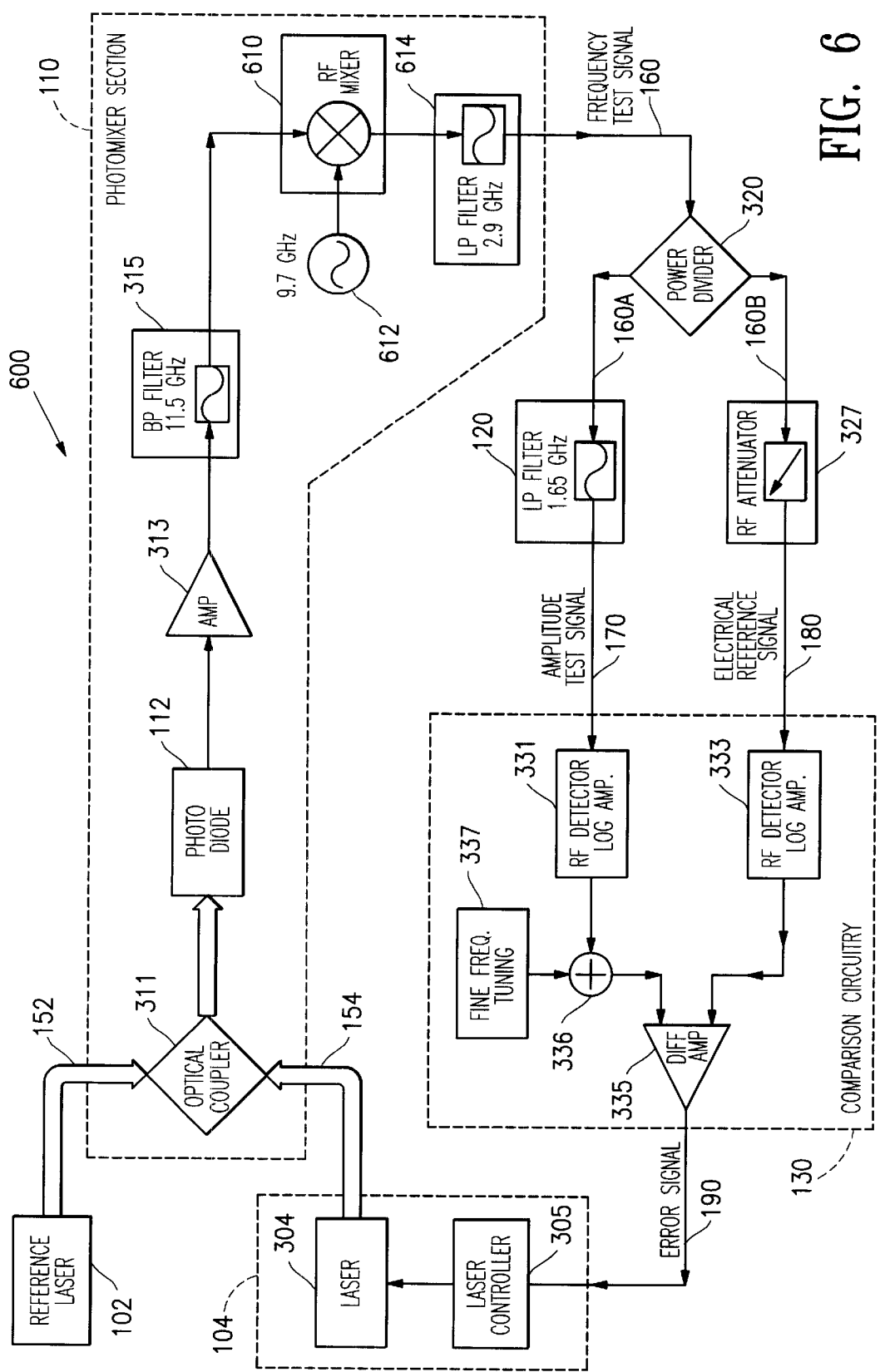
FIG. 6 is a block diagram of another embodiment of the wavelength-locking device of FIG. 1.

FIG. 6 is a block diagram of a second embodiment 600 of device 100. The major difference between devices 600 and 300 is that in device 600 the beat component is not used as the frequency test signal. Rather the beat component is electrically mixed down to an intermediate frequency and the intermediate signal is used as the frequency test signal 160. Accordingly, devices 600 and 300 are the same except for the following differences.

In the photomixer section 110, device 600 includes the following additional components: an RF mixer 610, a 9.7 GHz electrical oscillator 612, and a low pass filter 614. The electrical mixer 610 receives the 11.5 GHz beat component from bandpass filter 315 and mixes it with the 9.7 GHz signal from oscillator 612. This frequency shifts the beat component down to 1.8 GHz. The 2.9 GHz low pass filter 614 is used to clean up the frequency spectrum. The target frequency for device 600 is also down shifted by 9.7 GHz to 1.85 GHz. The lower target frequency is advantageous since the remaining electronics can be slower.

As a result of this lower target frequency, frequency filter 120 is implemented as a low pass filter with a 3 dB point of 1.65 GHz. The two log amplitude detectors 331 and 333 are 2.5 GHz Analog Devices AD8313 logarithmic detectors. The remainder of device 600 is essentially unchanged from device 300.

Figure 7:
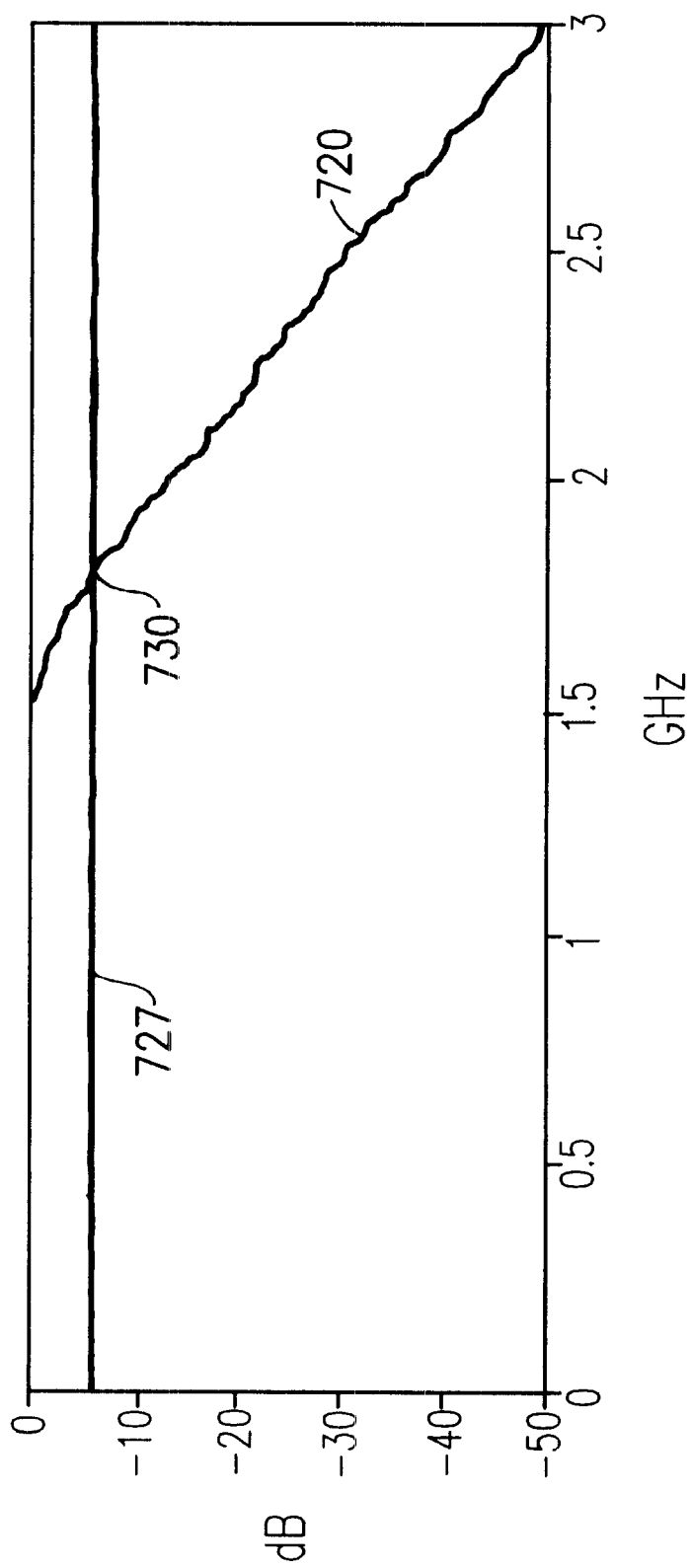
FIG. 7 is a graph illustrating the transfer functions for the low pass filter and RF attenuator in the device of FIG. 6.

FIG. 7 shows the monotonically decreasing transfer function 720 for low pass filter 120 and the constant transfer function 727 for RF attenuator 327. In this case, the crossover point 730 is approximately located at the target frequency of 1.85 GHz. The voltage offset 337 is used to make fine adjustments, as with device 300.

Figure 8:
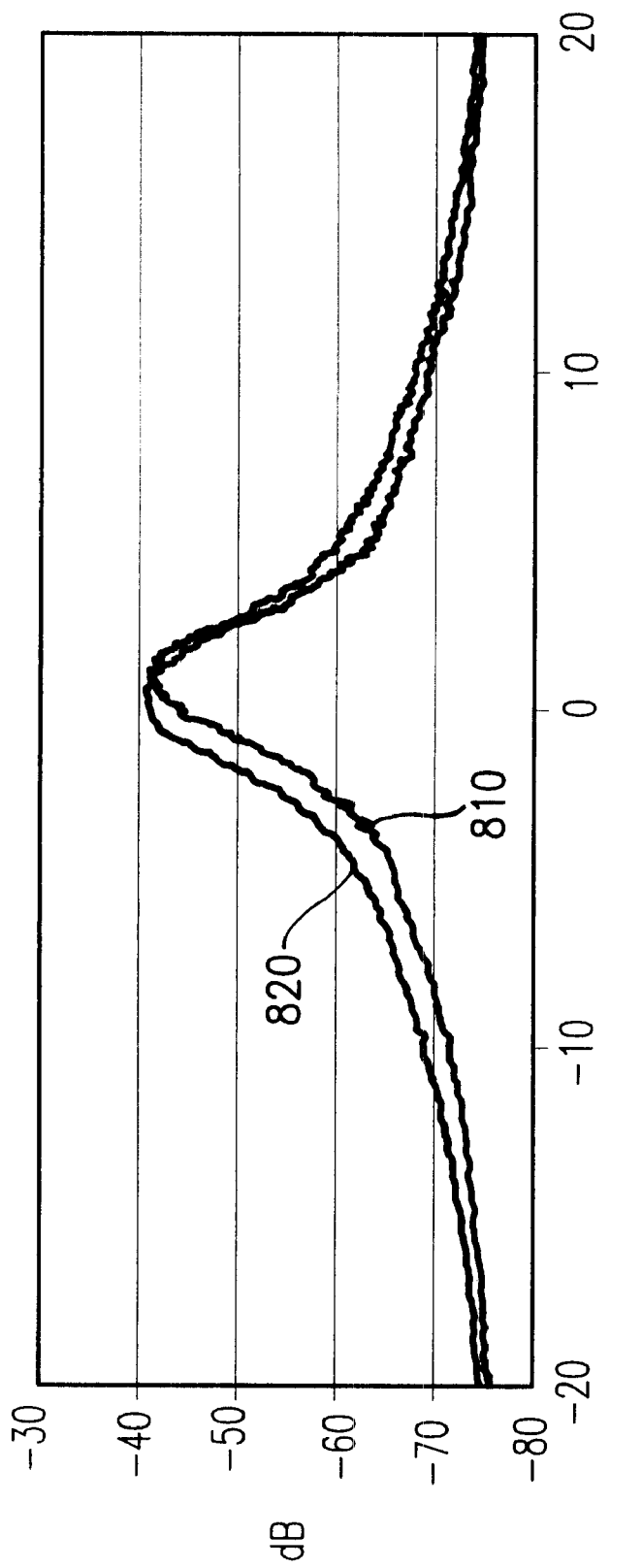
FIG. 8 is a graph illustrating the performance of the device of FIG. 6.

FIG. 8 is a graph illustrating the performance of device 600. Both traces 810 and 820 are frequency spectra showing deviations of the beat component from the 11.55 GHz offset. Trace 810 shows a single sweep of the spectrum. Trace 820 shows a spectrum analyzer maximum hold for 24 hours. The frequency drift is less than 1 MHz.

Figure 9:
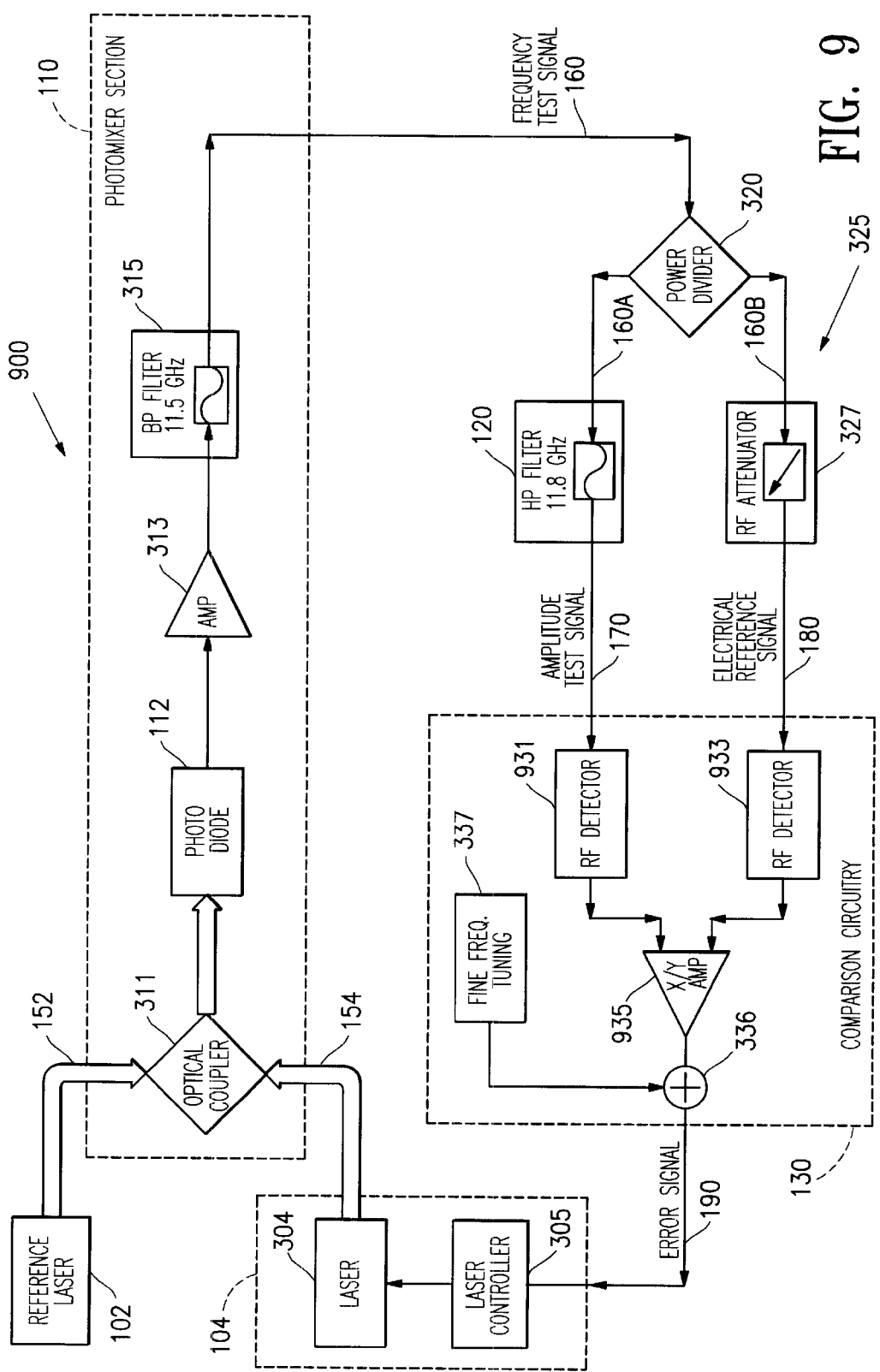
FIG. 9 is a block diagram of another embodiment of the wavelength-locking device of FIG. 1.

FIG. 9 is a block diagram of a third embodiment 900 of device 100. The major difference between devices 900 and 300 is the manner in which the ratio of the amplitude test signal 170 to the electrical reference signal 180 is generated by comparison circuitry 130. In device 300, compression circuitry 130 used two log amplitude detectors 331,333 coupled to a differential amplifier 335. In device 900, comparison circuitry 130 simply uses two matched amplitude detectors 931,933 (linear amplitude detectors in this case, but not necessarily so) coupled to an X/Y amplifier 935. Each detector 931,933 produces an output which reflects the amplitude of the amplitude test signal 170 or the electrical reference signal 180, respectively. The X/Y amplifier 935 compares the two detector outputs and generates a signal which reflects the ratio of the two outputs, for example a positive voltage if the amplitude from detector 931 is greater than that from detector 933, zero voltage if the two amplitudes are equal, and a negative voltage if the amplitude from detector 933 is greater. Hence, the X/Y amplifier output can be used as an error signal to lock the ratio of the two received amplitudes at a value of unity.

The adjustable voltage source 337 and voltage summer 336 are used to lock to ratios other than unity. Specifically, the voltage produced by voltage source 337 is added to the output of the X/Y amplifier 935 by voltage summer 336. This added bias effectively shifts the zero voltage point from a ratio of unity to some other ratio, depending on the sign of the voltage from voltage source 337.

Figure 10:
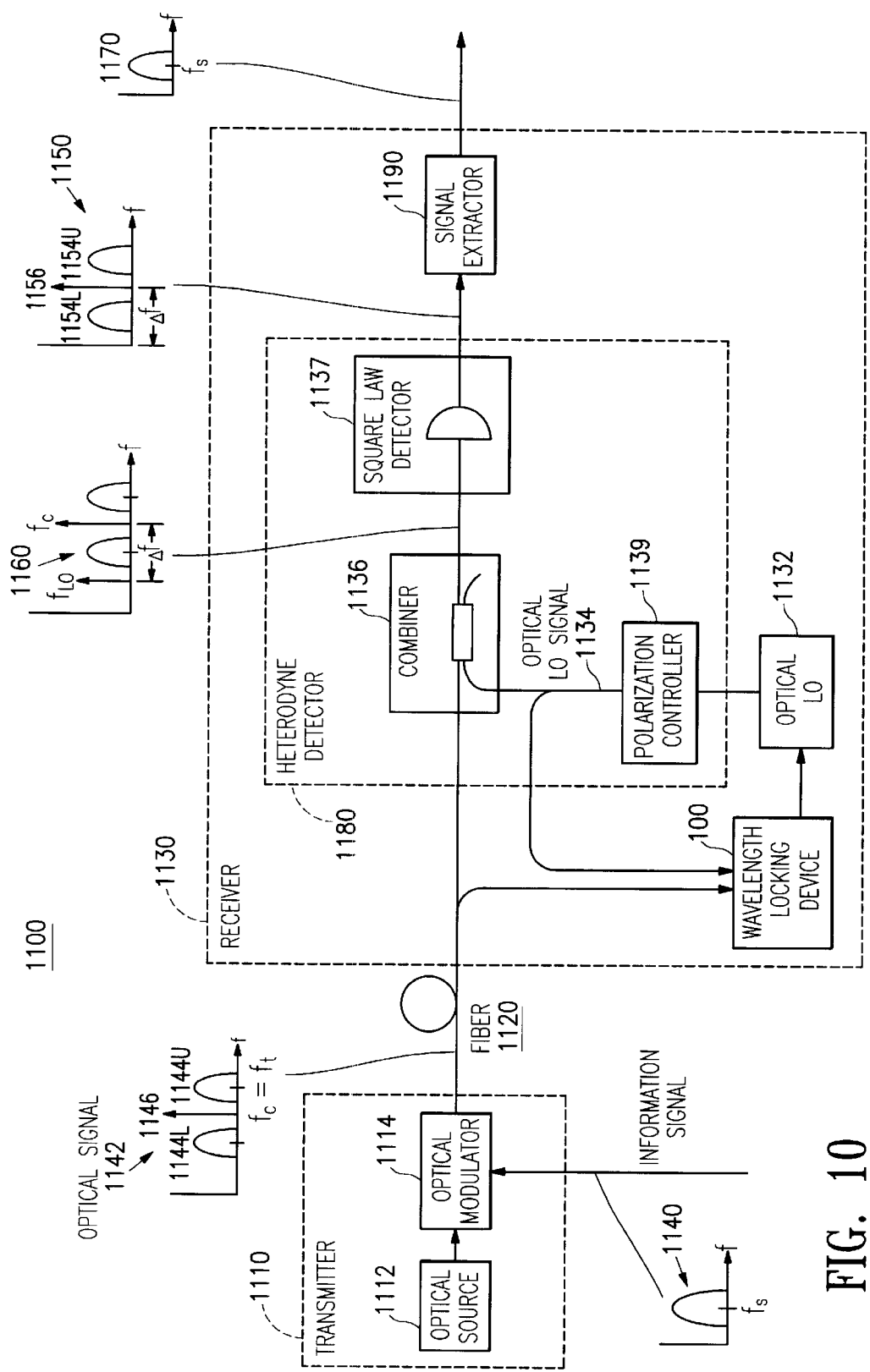
FIG. 10 is a block diagram of a system including the wavelength-locking device of FIG. 1.
Figure 11:
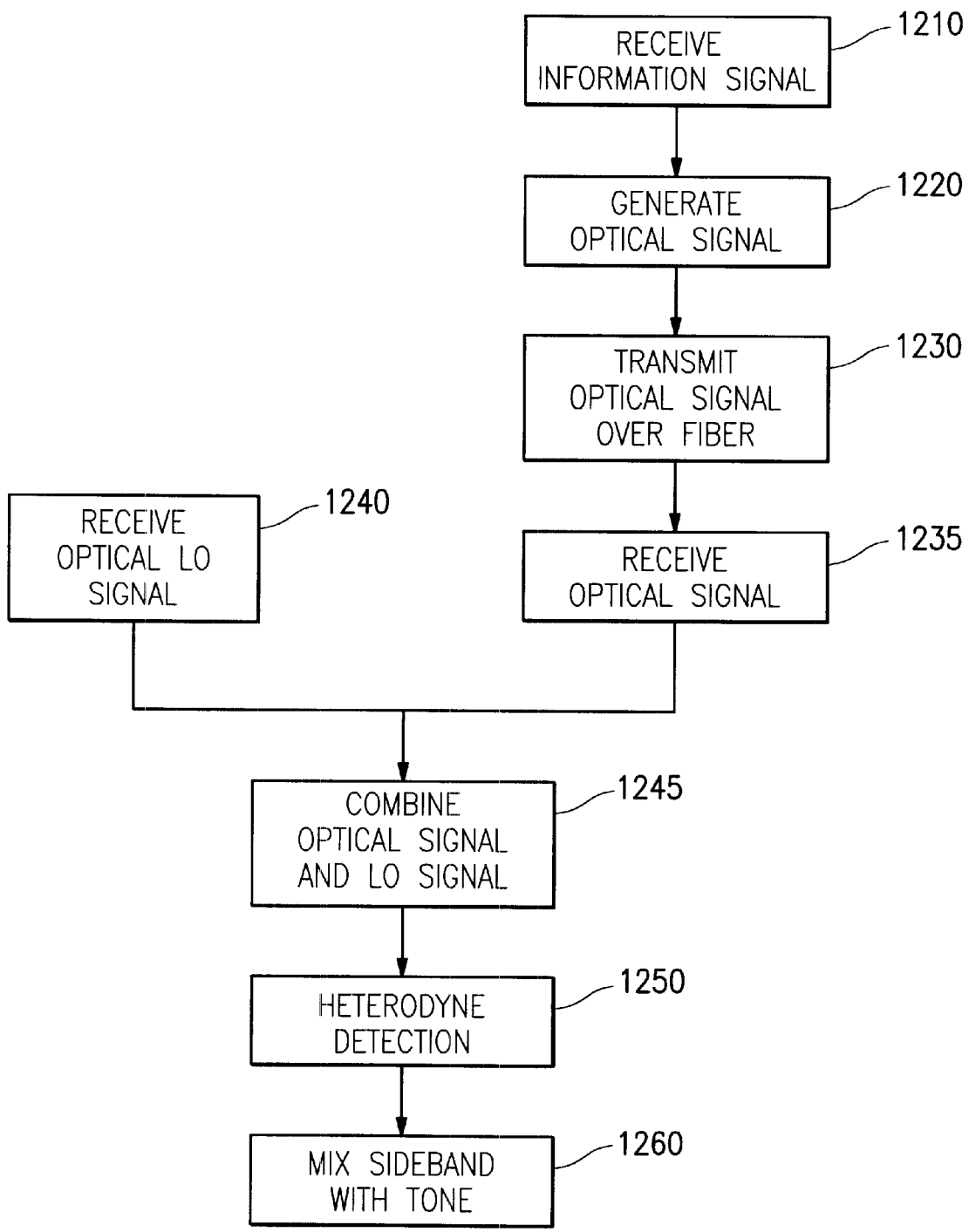
FIG. 11 diagram illustrating operation of the system in FIG. 10.
Figure 12:
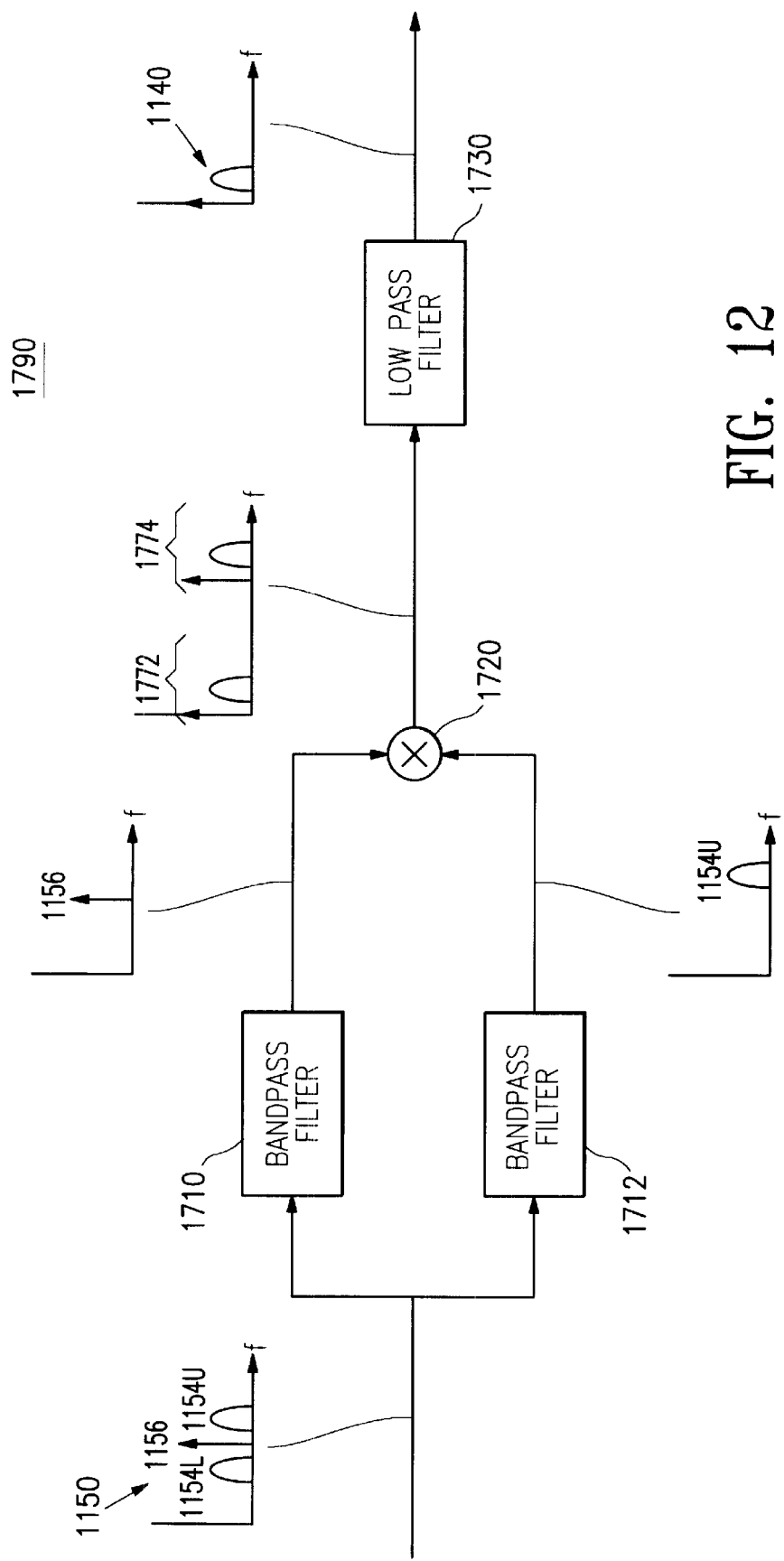
FIG. 12 is a block diagram of one embodiment of the signal extractor in FIG. 11.

FIGS. 10–12 illustrate a fiber optic communications system which uses a wavelength locking device, such as described above, as part of a heterodyne receiver. Further approaches to heterodyne detection of an optical signal in fiber optic communications systems are described in co-pending U.S. patent application Ser. No. 09/474,659, "Optical Communications System Using Heterodyne Detection", by Ting K. Yee and Peter H. Chang, filed Dec. 29, 1999; and U.S. patent application Ser. No. 09/728,373, ""Optical Communications System Using Multiple Heterodyne Detection", by Ting K. Yee and Peter H. Chang, filed Nov. 28, 2000. The subject matter of both of the foregoing are incorporated herein by reference. In the systems described in these two patent applications, the wavelength-locking devices described above can be used to lock the heterodyne receiver's local oscillator to a signal received by the heterodyne receiver with some frequency offset, as is described in more detail below.

FIG. 10 is a diagram of a system 1100 including the wavelength locking device 100. System 1100 includes a transmitter 1110 coupled to a receiver 1130 by optical fiber 1120. The receiver 1130 preferably includes a heterodyne detector 1180 coupled to a signal extractor 1190. System 1100 is used to transmit an information signal from transmitter 1110 to receiver 1130 via fiber 1120.

With reference to the flow diagram of FIG. 11 as well as to FIG. 10, system 1100 operates as follows. The frequency spectrum of an example information signal is shown by spectrum 1140, which is characterized by a frequency $f_s$. The frequency $f_s$ could be zero, for example, if the information signal is based on on-off keying. The information signal 1140 may be any of a variety of signals. For example, it may be a single high speed data stream. Alternately, it may contain a number of data streams which are time-division multiplexed together, for example, if 64 OC-3 data streams are combined together to form a single OC-192 signal, which serves as the information signal 1140. As another example, the information signal may include a number of constituent signals, each of which occupies a different frequency band within spectrum 1140. In other words, the constituent signals may be frequency division multiplexed together. For example, see co-pending U.S. patent application Ser. No. 09/405,367, "Optical Communications Networks Utilizing Frequency Division Multiplexing," by Michael W. Rowan, et al., filed Sep. 24, 1999, which is incorporated by reference herein in its entirety. Other types of information signals 1140 and methods for combining constituent signals to form the information signal 1140 will be apparent.

Transmitter 1110 receives 1210 the information signal 1140 and generates 1220 an optical signal 1142. Optical signal 1142 is characterized by a carrier frequency $f_c$ and includes at least one sideband 1144 based on the information signal 1140 and at least one tone 1146, shown at a frequency $f_t$ in the following examples. Various techniques may be used to achieve this function. In a preferred embodiment, transmitter 1110 includes an optical source 1112 coupled to an optical modulator 1114. Examples of optical sources include solid state lasers and semiconductor lasers. Example optical modulators 1114 include Mach Zehnder modulators, electro-optic modulators, and electro-absorptive modulators. The optical source 1112 produces an optical carrier at the carrier frequency $f_c$. The modulator 1114 receives 1210 the information signal 1140 and modulates the optical carrier with the information signal 1140 to generate 1220 optical signal 1142. In the example of FIG. 10, double sideband modulation is illustrated, resulting in two sidebands (upper sideband 1144U and lower sideband 1144L) which are centered about the carrier frequency $f_c$. Other types of modulation, such as single sideband modulation, could also be used. Continuing this example, the modulator 1114 also produces a significant signal at the carrier frequency $f_c$, which serves as a tone 1146. In another embodiment, a pilot tone may be added to the information signal to generate a tone located at a frequency other than the carrier frequency $f_c$. Alternately, transmitter 1110 may include an internally modulated laser. In this case, the information signal 1140 drives the laser, the output of which is the optical signal 1142.

The optical signal 1142 is transmitted 1230 over fiber 1120 to receiver 1130. Current optical fibers have two spectral regions which are commonly used for communications: the 1.3 and 1.55 micron regions. At a wavelength of 1.3 micron, transmission of the optical signal is primarily limited by attenuation in the fiber 1120; dispersion is less of a factor. Conversely, at a wavelength of 1.55 micron, the optical signal will experience more dispersion but less attenuation. Hence, the optical signal preferably has a wavelength either in the 1.3 micron region or the 1.55 micron region and, for long distance communications systems, the 1.55 micron region is generally preferred.

At receiver 1130, heterodyne detector 1180 receives 1235 the incoming optical signal 1142 and also receives 1240 an optical local oscillator signal 1134 at a frequency $f_{LO}$. In FIG. 10, the local oscillator signal 1134 is shown at a frequency $f_{LO}$ which is lower than the carrier frequency $f_c$, but the local oscillator signal 1134 may also be located at a frequency $f_{LO}$ which is higher than the carrier frequency $f_c$. Examples of optical local oscillators 1132 include solid state lasers and semiconductor lasers. The optical signal 1142 and local oscillator signal 1134 are combined 1245 and heterodyne detection 1250 of the combined signal effectively downshifts the optical signal 1142 from a carrier at frequency $f_c$ to a frequency $\Delta f$, which is the difference between the local oscillator frequency $f_{LO}$ and the carrier frequency $f_c$. The receiver 1130 includes a wavelength-locking device 100, which is used to maintain the frequency offset $\Delta f$ between the local oscillator frequency $f_{LO}$ and the carrier frequency $f_c$. More specifically, the local oscillator signal 1134 in FIG. 10 corresponds to the wavelength variable optical signal 154 in FIG. 1, and the optical signal 1142 in FIG. 10 (most likely, the optical carrier 1146) corresponds to the optical reference signal 152 in FIG. 1.

The resulting electrical signal has spectrum 1150. Note that both sidebands 1154L and 1154U, and tone 1156 have also been frequency downshifted compared to optical signal 1142. Signal extractor 1190 then mixes 1260 at least one of the sidebands 1154 with one of the tones 1156 to produce a number of frequency components, including one frequency component 1170 located at the difference frequency $\Delta f$ between the relevant sideband 1154 and tone 1156. This difference component 1170 contains the information signal 1140, although it may be offset in frequency from the original frequency $f_s$, depending on the frequencies of the sideband 1154 and tone 1156. Frequency components other than the difference component 1170 may be used to recover the information signal. For example, the mixing 1260 typically also produces a sum component located at the sum of the frequencies of the relevant sideband 1154 and tone 1156, and the information signal 1140 may be recovered from this sum component rather than the difference component. If more than one sideband 1154 is processed by signal extractor 1190, each sideband 1154 is processed separately from the others in a manner which prevents destructive interference between the sidebands.

However, recovering the information signal 1140 based on the difference component of sideband 1154 and tone 1156 is advantageous because it results in noise cancellation. For example, sideband 1154L and tone 1156 are affected similarly by laser phase noise produced by optical source 1112 and optical local oscillator 1132. Using the difference component effectively subtracts the laser phase noise in sideband 1154L from the laser phase noise in tone 1156, resulting in significant cancellation of this noise source. In contrast, using the sum component would effectively reinforce the laser phase noise.

Processing the sidebands 1154 separately from each other is also advantageous because it significantly reduces dispersion effects caused by fiber 1120. For example, in direct detection receivers, upper and lower sidebands 1154U and 1154L would be processed together and, at certain frequencies for the sidebands 1154 and lengths of fiber 1120, the dispersion effects of fiber 1120 would cause the two sidebands to destructively interfere, significantly impairing the recovery of information signal 1140. By processing sidebands 1154 separately from each other, signal extractor 1190 avoids this deleterious dispersion effect.

In a preferred embodiment, heterodyne detector 1180 includes a combiner 1136 and a square law detector 1137 coupled in series. Combiner 1136 preferably is a fiber coupler, due to its low cost and applicability to fiber systems, although other types of combiners may be used. Square law detector 1137 preferably is a PIN diode. Combiner 1136 receives 1235 the incoming optical signal 1142 at one of its inputs and receives 1240 the optical local oscillator signal 1134 at the other input. Combiner 1136 combines the local oscillator signal 1134 with the optical signal 1142 to produce the combined signal with spectrum 1160. Heterodyne detector may also include a polarization controller 1139 coupled to the combiner 1136 for matching the polarizations of the optical signal 1142 and the local oscillator signal 1134 so that the two signals are mixed efficiently at the square law detector 1137. In FIG. 10, the polarization controller 1139 is shown located between the local oscillator 1132 and combiner 1136 and controls the polarization of the local oscillator signal 1134. Alternately, the polarization controller 1139 may be located between the fiber 1120 and combiner 1136 and control the polarization of the optical signal 1142. In another approach, polarization controller 1139 may control the polarizations of both signals 1134 and 1142. Square law detector 1137 produces a photocurrent which is proportional to the intensity of signal 1160, which effectively mixes together the various frequency components in spectrum 1160. The resulting electrical signal has a number of frequency components located at different frequencies, with the components of interest shown by spectrum 1150. Spectrum 1150 is similar to spectrum 1142, but frequency downshifted from the carrier frequency $f_c$ to the difference frequency $\Delta f$.

FIG. 12 is a block diagram of an embodiment 1790 of signal extractor 1190 based on multiplying a tone with a sideband. This extractor 1790 includes two bandpass filters 1710 and 1712, a multiplier 1720 and a low pass filter 1730. The two bandpass filters 1710, 1712 are each coupled to receive the incoming electrical signal 1150 and are coupled on their outputs to multiplier 1720. The multiplier is coupled to low pass filter 1730.

Bandpass filter 1710 selects a tone 1156 and bandpass filter 1712 selects one of the sidebands 1154. In this specific example, the optical carrier and upper sideband 1154U are the selected components. Multiplier 1720 multiplies the tone 1156 against the selected sideband 1154U, resulting in a signal with a sum component 1774 and a difference component 1772. Low pass filter 1730 selects the difference component 1772, thus recovering the information signal 1140.

With reference to FIGS. 10–12, without a wavelength locking device such as device 100, the wavelengths of the optical local oscillator 1134 and the optical carrier 1146 generally will drift with respect to each other. As a result, the difference frequency $\Delta f$ will also drift, meaning that the spectral location of signal 1150 will drift as well. The design of signal extractor 1190 will be more complex if it must accommodate this potential drift. Wavelength-locking device 100 reduces this drift and therefore simplifies the design of signal extractor 1190 and improves the overall system performance.

In a preferred embodiment, the wavelength-locking device 100 ensures that the drift of frequency $\Delta f$ is reduced so that signal 1150 does not fall outside the bandwidth of signal extractor 1190. Using signal extractor 1790 as an example, wavelength-locking device reduces the drift so that bandpass filters 1710 and 1712 extract the correct components 1156 and 1154U, respectively. The remainder of signal extractor 1790 then operates correctly. Note that both components 1156 and 1154U incur the same frequency drift as the difference frequency $\Delta f$ and therefore remain in the same relative frequency relation to each other. Therefore, this common drift is removed by multiplier 1720 in difference component 1772. The combination of wavelength-locking device 100 and signal extracter 1790 results in a stable output signal 1140.

Figure 13:
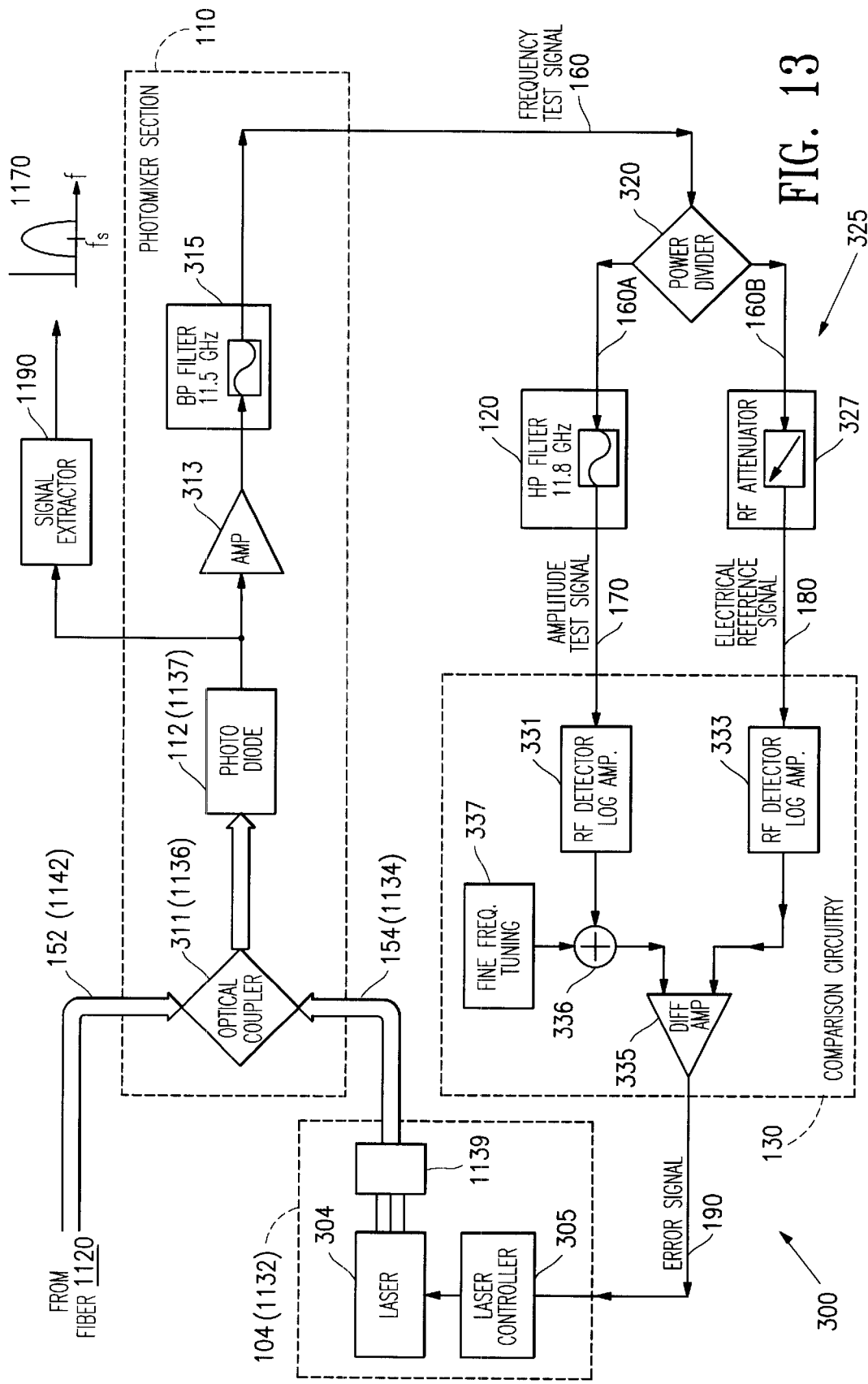
FIG. 13 is a block diagram of one embodiment of the receiver shown in FIG. 10.

FIGS. 10–12 depict the wavelength-locking device 100 as a separate component. It should be understood that this is only for illustrative purposes and portions of the wavelength-locking device 100 (as well as the other components within receiver 1130) may be integrated with other components within receiver 1130. For example, FIG. 13 is a block diagram of one embodiment in which the wavelength-locking device 300 of FIG. 3 is integrated with the heterodyne detector 1180 of FIG. 10. In this example, the wavelength-locking device 300 is the same as in FIG. 3. However, the optical reference signal 152 from reference laser 102 in FIG. 3 is now the optical signal 1142 from optical fiber 1120, and the wavelength-variable optical source 104 in FIG. 3 is the optical local oscillator 1132 including polarization controller 1139, as indicated by the reference numerals in parentheses. The optical coupler 311 and photodiode 112 in the wavelength-locking device 300 also function as the combiner 1136 and square law detector 1137 of the heterodyne detector 1180 in FIG. 10. The output of the photodiode 112 is sent to the signal extractor 1190, consistent with FIG. 10. More integration is possible, for example if the signal extractor 1190 uses the same filtering, mixing and/or detection implemented by the rest of the wavelength-locking device 300.

Although, the invention has been described in considerable detail with reference to certain preferred embodiments thereof, other embodiments are possible. For example, the specific components (e.g., laser diodes, Analog Devices log amplitude detectors, etc.) and numbers (e.g., 11.55 GHz offset, 6 dB attenuator, etc.) used in these examples are purely illustrative and not meant to limit the invention. Therefore, the scope of the appended claims should not be limited to the description of the preferred embodiments contained herein.

What is claimed is:

1. A device for wavelength locking a wavelength-variable optical signal to a target wavelength which is offset from a wavelength of an optical reference signal by a preselected frequency offset, the device comprising:

a photomixer section including a square law detector for mixing the wavelength-variable optical signal with the optical reference signal to produce a beat component and further for producing a frequency test signal from the beat component, wherein the frequency test signal is located at a target frequency when the wavelength-variable optical signal is at the target wavelength;

a frequency filter coupled to the photomixer section having a transfer function which varies monotonically over an operating region around the target frequency, for applying a frequency-dependent gain to the frequency test signal to produce an amplitude test signal, wherein the frequency filter applies a target gain when the frequency test signal is located at the target frequency; and comparison circuitry coupled to the frequency filter and adapted to receive an electrical reference signal for comparing the amplitude test signal with the electrical reference signal to determine whether the frequency filter applied the target gain.

2. The device of claim 1 wherein:

the frequency test signal includes the beat component; and
the target frequency equals the preselected frequency offset.

3. The device of claim 1 wherein the photomixer section further comprises:

an electrical mixer for frequency shifting the beat component by a fixed amount, wherein
the target frequency is also frequency shifted by the fixed amount.

4. The device of claim 1 wherein the frequency filter is selected from a group consisting of:

a low pass filter for which the target frequency lies at a frequency higher than the 3 dB passband of the low pass filter; and a high pass filter for which the target frequency lies at a frequency lower than the 3 dB passband of the high pass filter.

5. The device of claim 1 wherein the comparison circuitry comprises:
- a first amplitude detector coupled to the frequency filter for detecting an amplitude of the amplitude test signal;
- a second amplitude detector for detecting an amplitude of the electrical reference signal, wherein the first and second amplitude detectors are matched to each other; and
- a differential amplifier having two inputs, one input coupled to the first amplitude detector, the other input coupled to the second amplitude detector, the differential amplifier for comparing the amplitude of the signals received at the two inputs.

6. The device of claim 5 wherein the first and second amplitude detectors include first and second log amplitude detectors, respectively.

7. The device of claim 6 wherein the comparison circuitry further comprises:
- an adjustable voltage source coupled to the differential amplifier for providing an adjustable offset to the differential amplifier.

8. The device of claim 1 wherein the comparison circuitry comprises:
- a first amplitude detector coupled to the frequency filter for detecting an amplitude of the amplitude test signal;
- a second amplitude detector for detecting an amplitude of the electrical reference signal, wherein the first and second amplitude detectors are matched to each other; and
- an X/Y amplifier having two inputs, one input coupled to the first amplitude detector, the other input coupled to the second amplitude detector, the X/Y amplifier for generating an output based on a ratio of the amplitudes of the signals received at the two inputs.

9. The device of claim 8 wherein the comparison circuitry further comprises:
- an adjustable voltage source for providing an adjustable offset; and
- a voltage summer coupled to the adjustable voltage source and the output of the X/Y amplifier.

10. The device of claim 1 wherein the comparison circuitry is insensitive to variations in an amplitude of the frequency test signal in determining whether the frequency filter applied the target gain.

11. The device of claim 1 further comprising:
- a power divider coupled between the photomixer section and the frequency filter for splitting the frequency test signal into a first frequency test signal and a second frequency test signal, wherein the frequency filter applies the frequency-dependent gain to the first frequency test signal to produce the amplitude test signal; and
- an electrical reference arm coupled between the power divider and the comparison circuitry for generating the electrical reference signal from the second frequency test signal.

12. The device of claim 11 wherein the electrical reference arm comprises:
- an attenuator for attenuating the second frequency test signal by an amount independent of frequency.

13. The device of claim 11 wherein the comparison circuitry comprises:
- a first log amplitude detector coupled to the frequency filter for detecting a log of an amplitude of the amplitude test signal;
- a second log amplitude detector coupled to the electrical reference arm for detecting a log of an amplitude of the electrical reference signal, wherein the first and second log amplitude detectors are matched to each other;
- a differential amplifier having two inputs, one input coupled to the first log amplitude detector, the other input coupled to the second log amplitude detector, the differential amplifier for comparing the amplitude of the signals received at the two inputs; and
- an adjustable voltage source coupled to the differential amplifier for providing an adjustable offset to the differential amplifier.

14. The device of claim 11 wherein the comparison circuitry comprises:
- a first amplitude detector coupled to the frequency filter for detecting an amplitude of the amplitude test signal;
- a second amplitude detector coupled to the electrical reference arm for detecting an amplitude of the electrical reference signal, wherein the first and second amplitude detectors are matched to each other;
- an X/Y amplifier having two inputs, one input coupled to the first amplitude detector, the other input coupled to the second amplitude detector, the X/Y amplifier for generating an output based on a ratio of the amplitudes of the signals received at the two inputs;
- an adjustable voltage source for providing an adjustable offset; and
- a voltage summer coupled to the adjustable voltage source and the output of the X/Y amplifier.

15. The device of claim 1 further comprising:
- a wavelength-adjustable optical source coupled to the comparison circuitry for generating the wavelength-variable optical signal and further for adjusting the wavelength of the wavelength-variable optical signal according to an error signal from the comparison circuitry, wherein the error signal is based on whether the frequency filter applied the target gain.

16. A method for wavelength locking a wavelength-variable optical signal to a target wavelength which is offset from a wavelength of an optical reference signal by a preselected frequency offset, the method comprising:
- receiving the wavelength-variable optical signal;
- receiving the optical reference signal;
- mixing the wavelength-variable optical signal with the optical reference signal to produce a beat component;
- producing a frequency test signal from the beat component, wherein the frequency test signal is located at a target frequency when the wavelength-variable optical signal is at the target wavelength;
- applying a frequency-dependent gain to the frequency test signal to produce an amplitude test signal, wherein the gain applied varies monotonically over an operating region around the target frequency and a target gain is applied when the frequency test signal is located at the target frequency;
- receiving an electrical reference signal;
- comparing the amplitude test signal with the electrical reference signal to determine whether the frequency filter applied the target gain; and
- generating an error signal based on whether the frequency filter applied the target gain.

17. The method of claim 16 wherein:
- the frequency test signal includes the beat component; and
- the target frequency equals the preselected frequency offset.

18. The method of claim 16 wherein the step of producing a frequency test signal from the beat component comprises:

frequency shifting the beat component by a fixed amount, wherein the target frequency is also frequency shifted by the fixed amount.

19. The method of claim 16 wherein the frequency-dependent gain applied to the frequency test signal is selected from a group consisting of:

a transfer function for a low pass filter for which the target frequency lies at a frequency higher than the 3 dB passband of the low pass filter; and a transfer function for a high pass filter for which the target frequency lies at a frequency lower than the 3 dB passband of the high pass filter.

20. The method of claim 16 wherein the step of comparing the amplitude test signal with the electrical reference signal comprises:

detecting an amplitude of the amplitude test signal;

detecting an amplitude of the electrical reference signal; and comparing the detected amplitudes.

21. The method of claim 20 wherein:

the step of detecting an amplitude of the amplitude test signal includes detecting a log of the amplitude of the amplitude test signal; and the step of detecting an amplitude of the electrical reference signal includes detecting a log of the amplitude of the electrical reference signal.

22. The method of claim 21 wherein the step of comparing the detected amplitudes comprises:

adding an offset to one of the detected amplitudes; and determining whether the offset detected amplitude is equal to the other detected amplitude.

23. The method of claim 20 wherein the step of comparing the detected amplitudes comprises:

comparing based on a ratio of the detected amplitudes.

24. The method of claim 16 wherein the step of comparing the amplitude test signal with the electrical reference signal to determine whether the frequency filter applied the target gain is insensitive to variations in an amplitude of the frequency test signal.

25. The method of claim 16 further comprising:

splitting the frequency test signal into a first frequency test signal and a second frequency test signal, wherein the step of applying a frequency-dependent gain to the frequency test signal includes applying the frequency-dependent gain to the first frequency test signal; and generating the electrical reference signal from the second frequency test signal.

26. The method of claim 25 wherein the step of generating the electrical reference signal from the second frequency test signal comprises:

attenuating the second frequency test signal by an amount independent of frequency.

27. The method of claim 25 wherein the step of comparing the amplitude test signal with the electrical reference signal comprises:

detecting a log of an amplitude of the amplitude test signal;

detecting a log of an amplitude of the electrical reference signal;

adding an offset to one of the detected amplitudes; and determining whether the offset detected amplitude is equal to the other detected amplitude.

28. The method of claim 25 wherein the step of comparing the amplitude test signal with the electrical reference signal comprises:

determining whether a ratio of the detected amplitudes is equal to a preselected ratio.

29. The method of claim 16 further comprising:

generating the wavelength-variable optical signal; and adjusting the wavelength of the wavelength-variable optical signal according to whether the frequency filter applied the target gain.

30. A receiver for recovering an information signal from an optical signal containing the information signal, the receiver comprising:

a heterodyne detector for mixing an optical local oscillator signal at a first wavelength with an optical signal at a second wavelength, the optical signal including at least one tone and a first sideband of the information signal, to produce an electrical signal which is a frequency down-shifted version of the optical signal;

a signal extractor coupled to the heterodyne detector for mixing the first sideband of the electrical signal with one of the tones of the electrical signal to produce a first component containing the information signal; and a wavelength-locking device adapted to receive the optical local oscillator signal and the optical signal for wavelength locking the first wavelength of the optical local oscillator signal to a target wavelength which is offset from the second wavelength of the optical signal by a preselected frequency offset, the device comprising:

a photomixer section including a square law detector for mixing the optical local oscillator signal with the optical signal to produce a beat component and further for producing a frequency test signal from the beat component, wherein the frequency test signal is located at a target frequency when the optical local oscillator signal is at the target wavelength;

a frequency filter coupled to the photomixer section having a transfer function which varies monotonically over an operating region around the target frequency, for applying a frequency-dependent gain to the frequency test signal to produce an amplitude test signal, wherein the frequency filter applies a target gain when the frequency test signal is located at the target frequency; and comparison circuitry coupled to the frequency filter and adapted to receive an electrical reference signal for comparing the amplitude test signal with the electrical reference signal to determine whether the frequency filter applied the target gain.

31. The receiver of claim 30 wherein the frequency filter is selected from a group consisting of:

a low pass filter for which the target frequency lies at a frequency higher than the 3 dB passband of the low pass filter; and a high pass filter for which the target frequency lies at a frequency lower than the 3 dB passband of the high pass filter.

32. The receiver of claim 30 wherein the comparison circuitry is insensitive to variations in an amplitude of the frequency test signal in determining whether the frequency filter applied the target gain.

33. The receiver of claim 30 further comprising:

a power divider coupled between the photomixer section and the frequency filter for splitting the frequency test signal into a first frequency test signal and a second frequency test signal, wherein the frequency filter applies the frequency-dependent gain to the first frequency test signal to produce the amplitude test signal; and an electrical reference arm coupled between the power divider and the comparison circuitry for generating the electrical reference signal from the second frequency test signal.

34. The receiver of claim 33 wherein the comparison circuitry comprises:

a first log amplitude detector coupled to the frequency filter for detecting a log of an amplitude of the amplitude test signal;

a second log amplitude detector coupled to the electrical reference arm for detecting a log of an amplitude of the electrical reference signal, wherein the first and second log amplitude detectors are matched to each other; and a differential amplifier having two inputs, one input coupled to the first log amplitude detector, the other input coupled to the second log amplitude detector, the differential amplifier for comparing the amplitude of the signals received at the two inputs.

35. The receiver of claim 33 wherein the comparison circuitry comprises:

a first amplitude detector coupled to the frequency filter for detecting an amplitude of the amplitude test signal;

a second amplitude detector coupled to the electrical reference arm for detecting an amplitude of the electrical reference signal, wherein the first and second amplitude detectors are matched to each other; and an X/Y amplifier having two inputs, one input coupled to the first amplitude detector, the other input coupled to the second amplitude detector, the X/Y amplifier for generating an output based on a ratio of the amplitudes of the signals received at the two inputs.

36. The receiver of claim 30 wherein the heterodyne detector and the photomixer section of the wavelength-locking device include a common square law detector.

37. A method for recovering an information signal from an optical signal containing the information signal, the method comprising:

mixing an optical local oscillator signal at a first wavelength with an optical signal at a second wavelength, the optical signal including at least one tone and a first sideband of the information signal, to produce an electrical signal which is a frequency down-shifted version of the optical signal;

mixing the first sideband of the electrical signal with one of the tones of the electrical signal to produce a first component containing the information signal; and mixing the optical local oscillator signal with the optical signal to produce a beat component;

producing a frequency test signal from the beat component, wherein the frequency test signal is located at a target frequency when the optical local oscillator signal is at the target wavelength;

applying a frequency-dependent gain to the frequency test signal to produce an amplitude test signal, wherein the gain applied varies monotonically over an operating region around the target frequency and a target gain is applied when the frequency test signal is located at the target frequency;

comparing the amplitude test signal with the electrical reference signal to determine whether the frequency filter applied the target gain; and generating an error signal based on whether the frequency filter applied the target gain.

38. The method of claim 37 wherein the frequency-dependent gain applied to the frequency test signal is selected from a group consisting of:

a transfer function for a low pass filter for which the target frequency lies at a frequency higher than the 3 dB passband of the low pass filter; and a transfer function for a high pass filter for which the target frequency lies at a frequency lower than the 3 dB passband of the high pass filter.

39. The method of claim 37 wherein the step of comparing the amplitude test signal with the electrical reference signal to determine whether the frequency filter applied the target gain is insensitive to variations in an amplitude of the frequency test signal.

40. The method of claim 37 further comprising:

splitting the frequency test signal into a first frequency test signal and a second frequency test signal, wherein the step of applying a frequency-dependent gain to the frequency test signal includes applying the frequency-dependent gain to the first frequency test signal; and generating the electrical reference signal from the second frequency test signal.

41. The method of claim 40 wherein the step of comparing the amplitude test signal with the electrical reference signal comprises:

detecting a log of an amplitude of the amplitude test signal;

detecting a log of an amplitude of the electrical reference signal;

adding an offset to one of the detected amplitudes; and determining whether the offset detected amplitude is equal to the other detected amplitude.

42. The method of claim 40 wherein the step of comparing the amplitude test signal with the electrical reference signal comprises:

determining whether a ratio of the detected amplitudes is equal to a preselected ratio.

* * * * *